US007723864B2

(12) United States Patent
Zub et al.

(10) Patent No.: US 7,723,864 B2
(45) Date of Patent: May 25, 2010

(54) AC-TO-DC ELECTRICAL SWITCHING CIRCUIT

(75) Inventors: Walter Alexander Zub, Lone Tree, CO (US); Urs Thomas Moeker, Littleton, CO (US); Isaac Davenport, Boulder, CO (US); Nathaniel W. Crutcher, Westminster, CO (US)

(73) Assignee: Norgren, Inc., Littleton, CO (US)

( * ) Notice: Subject to any disclaimer, the term of this patent is extended or adjusted under 35 U.S.C. 154(b) by 489 days.

(21) Appl. No.: 11/189,646

(22) Filed: Jul. 26, 2005

(65) Prior Publication Data

US 2007/0025122 A1 Feb. 1, 2007

(51) Int. Cl.
*H02M 7/00* (2006.01)
*H02J 5/00* (2006.01)
(52) U.S. Cl. .............................. 307/29; 307/39; 307/82; 307/85; 307/86
(58) Field of Classification Search .................... 307/29
See application file for complete search history.

(56) References Cited

U.S. PATENT DOCUMENTS

| | | | | |
|---|---|---|---|---|
| 4,017,787 A | * | 4/1977 | Hara et al. ..................... 363/49 |
| 4,034,232 A | * | 7/1977 | LaVenture .................... 307/32 |
| 4,088,937 A | * | 5/1978 | Uchida et al. ................ 318/441 |
| 4,163,906 A | * | 8/1979 | Shimamura .................. 307/39 |
| 4,253,139 A | * | 2/1981 | Weiss .......................... 363/95 |
| 4,415,964 A | | 11/1983 | Scharfe, Jr. |
| 4,443,839 A | * | 4/1984 | Onodera et al. ............... 363/20 |
| 4,961,044 A | | 10/1990 | Kravitz |
| 5,045,712 A | * | 9/1991 | Baggenstoss ................. 307/29 |
| 5,089,752 A | | 2/1992 | Pacholok |
| 5,162,663 A | * | 11/1992 | Combs et al. ................. 307/29 |
| 5,260,605 A | * | 11/1993 | Barfield ....................... 307/127 |
| 5,402,059 A | * | 3/1995 | Bittar .......................... 323/223 |
| 5,424,932 A | * | 6/1995 | Inou et al. ................. 363/21.06 |
| 5,532,894 A | | 7/1996 | Sweaton |
| 558,446 A | | 12/1996 | Fukano et al. |
| 5,584,466 A | * | 12/1996 | Fukano et al. ................. 251/65 |
| 5,751,150 A | * | 5/1998 | Rippel et al. ................. 324/537 |
| 5,811,889 A | * | 9/1998 | Massie ......................... 307/44 |
| 5,929,614 A | | 7/1999 | Copple |
| 6,014,325 A | * | 1/2000 | Pecore ......................... 363/126 |

(Continued)

FOREIGN PATENT DOCUMENTS

JP 2002281762 9/2002

*Primary Examiner*—Stephen W Jackson
*Assistant Examiner*—Adi Amrany
(74) *Attorney, Agent, or Firm*—The Ollila Law Group LLC (57) ABSTRACT

An electrical circuit and method for switching an input voltage onto a load by way of an AC control voltage is provided. A voltage magnitude reduction circuit is configured to be driven by the AC control voltage. A rectifier circuit is operably coupled with the voltage magnitude reduction circuit. Also, a voltage limiter circuit is operably coupled with the rectifier circuit, and an energy storage circuit is operably coupled with the voltage limiter circuit. The voltage magnitude reduction circuit, the rectifier circuit, the energy storage circuit and the voltage limiter circuit cooperatively generate a switch control voltage. An electronic switching unit is then configured to switch the input voltage across the load when the switch control voltage is active. In one embodiment, the input voltage is a DC voltage generated by an AC-to-DC voltage converter circuit configured to convert an AC supply voltage to the DC voltage.

11 Claims, 5 Drawing Sheets

U.S. PATENT DOCUMENTS

| | | | | |
|---|---|---|---|---|
| 6,031,745 | A * | 2/2000 | Southman et al. | 363/70 |
| 6,069,806 | A * | 5/2000 | Lenz et al. | 363/70 |
| 6,232,754 | B1 * | 5/2001 | Liebler et al. | 323/272 |
| 6,265,855 | B1 * | 7/2001 | Aas et al. | 323/272 |
| 6,529,073 | B1 * | 3/2003 | Highfill et al. | 330/207 P |
| 6,717,386 | B1 * | 4/2004 | Kanasugi et al. | 322/27 |
| 6,784,648 | B2 * | 8/2004 | Mitamura et al. | 323/282 |
| 6,946,819 | B2 * | 9/2005 | Fagnani et al. | 323/207 |
| 7,170,767 | B2 * | 1/2007 | Bixel | 363/65 |
| 7,230,391 | B2 * | 6/2007 | Ravindra et al. | 315/219 |
| 7,380,146 | B2 * | 5/2008 | Swope | 713/320 |
| 2002/0024307 | A1 | 2/2002 | Bader | |
| 2002/0175661 | A1 | 11/2002 | Wheeler et al. | |
| 2002/0179347 | A1 | 12/2002 | Tamai et al. | |
| 2005/0219827 | A1 * | 10/2005 | Tateyama et al. | 361/736 |

* cited by examiner

AC-TO-DC ELECTRICAL SWITCHING CIRCUIT

FIELD OF THE INVENTION

Aspects of the invention relate generally to electrical voltage converter and switching circuits, and more particularly to electrical voltage converter and switching circuits employing an AC control voltage to switch an input voltage across a load.

BACKGROUND OF THE INVENTION

In the field of industrial hydraulic and pneumatic equipment, a mechanical valve is often employed to selectively open or close a hydraulic or pneumatic pathway or channel within the equipment. Typically, the valve is operated by way of a solenoid. In general, a solenoid includes a coiled conductor forming a cylinder, and a metallic core located within the cylinder. When the coil is energized by way of an electrical voltage, current flows through the coiled conductor, creating a magnetic field within the cylinder that induces a moving force upon the core along the long axis of the cylinder. When the energizing voltage is removed, the magnetic field is eliminated, and the related force on the core ceases.

When used in conjunction with a valve, the core may be attached to a portion of the valve, while the core is mechanically biased by a spring against a first mechanical "stop," or limit, so that the valve will remain in a first position, associated with either a closed or open state of the valve, when the solenoid is not energized. When a voltage is applied to the solenoid, the core moves to counteract the force of the spring, thereby changing the position of the valve to a second position defined by a second mechanical stop, thereby opening or closing the valve. In some applications, two or more solenoids may be employed in cooperation to open and close an associated valve.

In some hydraulic and pneumatic equipment, the valve directly acted upon by the solenoid is the primary valve of concern, termed a "direct acting valve." More typically, however, the valve acted upon by the solenoid is a "pilot valve," which allows air or liquid to pressurize a second, main valve, which then operates to force the main valve into an open or closed state.

Some solenoids are designed to be energized by a DC voltage, while others are operated via an AC voltage, depending on the particular application in which the valve is utilized. For example, some valve applications may require solenoids that accept a voltage of −24 volts DC (VDC), while others may employ solenoids that are properly energized with a line voltage of 115 volts AC (VAC) root-mean-square (RMS). Thus, a hydraulic and pneumatic equipment manufacturer may offer a range of versions of a particular valve product, with each version employing a different solenoid reactive to a particular AC or DC voltage. In so doing, the manufacturer's costs are often increased by designing, manufacturing and stocking multiple versions of valve products employing different solenoids.

Further, distribution of the voltage to the solenoid is often accomplished by way of an electrical connector or terminal strip and a printed circuit board (PCB). As a result, safety requirements, such as those specified by Underwriters Laboratories® and other safety testing organizations, necessitate larger wires or circuit traces, as well as greater spacing between traces or connection points, for larger AC voltages, such as 115 VAC, when compared to those required for smaller DC voltages, such as −24 VDC. These larger conductors and spacing typically increase the size of the PCBs and connectors, or mandate the use of the larger terminal strips, thus increasing the overall size of the valve product, and often rendering the product less desirable and more expensive to the customer.

SUMMARY OF THE INVENTION

Generally, embodiments of the present invention provide an electrical circuit for switching an input voltage onto a load by way of an AC control voltage. In one embodiment, the input voltage may be a DC voltage generated from an AC supply voltage by way of an AC-to-DC voltage converter circuit. The electrical switching circuit includes a voltage magnitude reduction circuit driven by the AC control voltage, a rectifier circuit operably coupled with the voltage magnitude reduction circuit, a voltage limiter circuit operably coupled with the rectifier circuit, and an energy storage circuit operably coupled with the voltage limiter circuit. The voltage magnitude reduction circuit, the rectifier circuit, the voltage limiter circuit and the energy storage circuit cooperate to generate a switch control voltage. The electrical switching circuit also includes an electronic switching unit configured to switch the input voltage onto the load when the switch control voltage is active.

Alternative embodiments of the invention provide a method for switching an input voltage onto a load when an AC control voltage is present. Generally, the method involves reducing the magnitude of the AC control voltage, rectifying the AC control voltage, storing energy generated by the AC control voltage to support a switch control voltage, limiting the voltage level of the switch control voltage, and applying the input voltage across the load when the switch control voltage is active. In one embodiment, the method also converts an AC supply voltage to a DC voltage to be employed as the input voltage.

Additional embodiments and advantages of the present invention will be realized by those skilled in the art upon perusal of the following detailed description, taken in conjunction with the accompanying drawings.

DETAILED DESCRIPTION OF THE INVENTION

Figure 1:
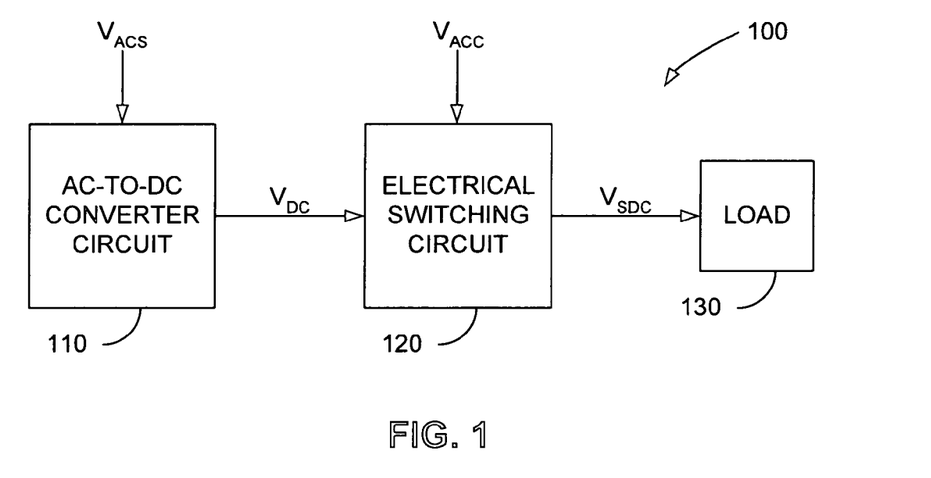
FIG. 1 is a block diagram of an electrical circuit according to an embodiment of the invention for converting an AC supply voltage to a DC voltage, and switching the DC voltage onto a load by way of an AC control voltage.

FIG. 1 is a block diagram of an embodiment of the invention, an electrical circuit 100 that converts an AC supply voltage into a DC voltage, which is then switched onto a load according to an AC control voltage signal. Such a circuit 100 may be employed as a voltage conversion and switching circuit for selectively energizing a solenoid for opening and closing a valve in pneumatic and hydraulic equipment, as discussed above. However, embodiments of the invention are not limited to such an environment, as many other applications may exist which benefit from the various embodiments of the invention described below.

Generally, the electrical circuit 100 is composed of an AC-to-DC converter circuit 110 and an electrical switching circuit 120. An AC supply voltage $V_{ACS}$ drives the AC-to-DC converter circuit 110, while an intermittently-active AC control voltage $V_{ACC}$ drives the electrical switching circuit 120. In one embodiment, the AC supply voltage $V_{ACS}$ and the AC control voltage $V_{ACC}$ are the same signal. Alternatively, the AC supply voltage $V_{ACS}$ may be a constant AC voltage separate from the AC control voltage $V_{ACC}$. Accordingly, the AC-to-DC converter circuit 110 generates a DC voltage $V_{DC}$ that is supplied to the electrical switching circuit 120. The AC control voltage $V_{ACC}$, when active, acts to apply the generated DC voltage $V_{DC}$ across a load 130. Oppositely, when the AC control voltage $V_{ACC}$ is not active (i.e., is substantially at zero volts, or presents an open circuit), the electrical switching circuit 120 decouples the output of the electrical switching circuit 120 from the load 130. The resulting output of the electrical switching circuit 120 is termed a switched DC voltage $V_{SDC}$.

The AC-to-DC converter circuit 110 is designed to convert the AC supply voltage $V_{ACS}$ into a DC voltage $V_{DC}$ appropriate for the particular application. In one embodiment, the AC-to-DC converter circuit 110 is designed to convert an AC supply voltage $V_{ACS}$ of 115 VAC to a DC voltage $V_{DC}$ of −24 VDC. In an alternative embodiment, the AC-to-DC converter circuit 110 is configured to convert an AC supply voltage $V_{ACS}$ of 115 VAC to a DC voltage $V_{DC}$ of +24 VDC.

In one embodiment, the AC-to-DC converter circuit 110 may include a commercial off-the-shelf device, such as an AC-to-DC converter integrated circuit (IC), electrically coupled with a limited number of discrete components, such as resistors and capacitors, specified by the IC manufacturer to perform the desired voltage conversion. The AC-to-DC converter circuit 110 may employ a linear power supply design utilizing a transformer and a rectifier bridge circuit. Alternatively, the AC-to-DC converter circuit 110 may use a switching power supply design. Such embodiments are likely to provide a low-cost solution occupying a small circuit space.

In another embodiment of the electrical circuit 100, the AC-to-DC converter circuit 110 may include a standard "brick" power supply converting a standard AC supply voltage $V_{ACS}$, such as a 115 VAC line voltage, into a desired DC voltage $V_{DC}$. In yet another embodiment, the AC supply voltage $V_{ACS}$ may be rectified and filtered to produce an intermediate DC voltage, and then converted to the desired DC voltage $V_{DC}$ by way of a DC-to-DC converter circuit or a linear regulator. Other embodiments employing varying electronics designs for converting the AC supply voltage $V_{ACS}$ to the DC voltage $V_{DC}$ may also be utilized in the alternative.

As mentioned above, the resulting DC voltage $V_{DC}$ from the AC-to-DC converter circuit 110 is applied to a load 130 by way of the electrical switching circuit 120, which utilizes an AC control voltage $V_{ACC}$ as a switching control signal to selectively apply the DC voltage $V_{DC}$ to the load 130, such as a solenoid. In one embodiment, the magnitude of the AC control voltage $V_{ACC}$ is substantially equal to the AC supply voltage $V_{ACS}$, thereby simplifying the environment in which the electrical circuit 100 operates. Further, as mentioned above, the AC control voltage $V_{ACC}$ and the AC supply voltage $V_{ACS}$ may be the same signal. In another embodiment, the electrical switching circuit 120 may switch an input voltage other than a DC voltage $V_{DC}$ derived from an AC supply voltage $V_{ACS}$.

Figure 2:
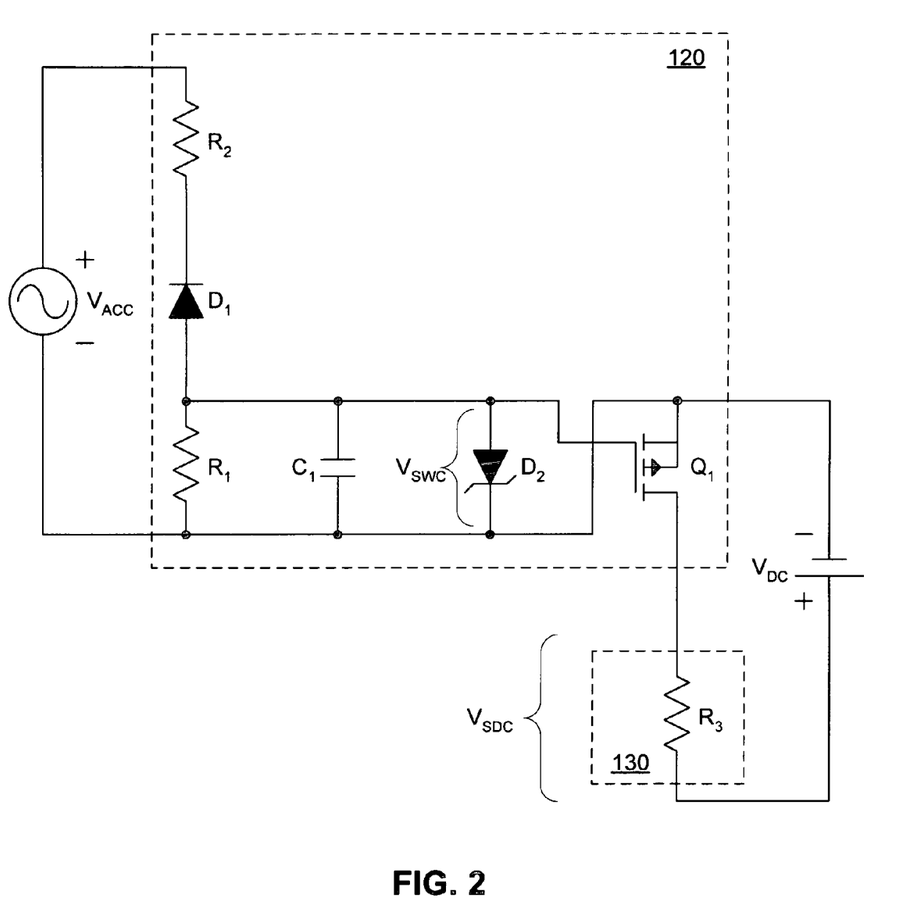
FIG. 2 is a schematic diagram of the electrical switching circuit of FIG. 1.

FIG. 2 provides a more detailed schematic diagram of the electrical switching circuit 120 according to an embodiment of the invention. The AC control voltage $V_{ACC}$ from the AC-to-DC converter circuit 110 is applied across a voltage magnitude reduction circuit, which in the particular example of FIG. 2 is a voltage divider containing a first resistor $R_1$ and a second resistor $R_2$. Typically, a voltage divider as configured in FIG. 2 reduces the magnitude of an AC control voltage $V_{ACC}$ by the factor $R_1/(R_1+R_2)$. The magnitude of the AC control voltage $V_{ACC}$ is reduced so that it may be utilized by the remainder of the electrical switching circuit 120 while presenting less of a safety concern for someone having physical access to the electrical switching circuit 120. In one embodiment, the value of the first resistor $R_1$ is 47 kilohms (kΩ), and the value of the second resistor $R_2$ is 100 kΩ.

Coupled with the voltage divider resistors $R_1$ and $R_2$ is a rectifier, which in the particular example of FIG. 2 is a diode $D_1$ configured to convert the AC control voltage $V_{ACC}$ to a half-wave-rectified AC voltage signal, whereby one-half of each cycle of the AC control voltage $V_{ACC}$ is passed onto the remainder of the electrical switching circuit 120. In the particular embodiment of FIG. 2, the diode $D_1$ is a 1N4006 800-volt, 1-ampere rectifier. In alternative embodiments, other methods of rectifying an AC voltage, including a full-wave-rectifier circuit, may be employed.

In addition to being rectified and reduced in magnitude, the AC control voltage $V_{ACS}$ is also coupled to a voltage limiter, such as a zener diode $D_2$, as illustrated in FIG. 2. The zener diode $D_2$ exhibits a reverse breakdown voltage which effectively limits the highest voltage appearing across the zener diode $D_2$. Typically, the selection of the zener diode $D_2$ is predicated on the voltage required to switch the DC supply voltage $V_{DCS}$ onto the load 130 of FIG. 1, as described in greater detail below. In one embodiment, the zener diode $D_2$ is an MMBZ5245BLT1, manufactured by ON Semiconductor®, which exhibits a reverse breakdown voltage of 15 V.

To aid in maintaining a somewhat constant voltage across the zener diode $D_2$, an energy storage circuit, such as a capacitor $C_1$ shown in the embodiment of FIG. 2, is employed to provide sufficient charge, and hence current, to the zener diode $D_2$ and remaining portions of the electrical switching circuit 120 during relatively short time periods of low voltage at the zener diode $D_2$ while the AC supply voltage $V_{ACS}$ is active. For example, in the embodiment of FIG. 2, the capacitor $C_1$ provides current to maintain a higher voltage level during each half-cycle of the AC control voltage $V_{ACC}$ that is being blocked by the rectifier diode $D_1$. In this particular example, the value of capacitor $C_1$ is 0.1 microfarads (μF). In alternative embodiments, other energy storage elements, such as inductors, may be configured and employed to similar end.

The combination of the magnitude reduction circuit, rectifier circuit, energy storage circuit, and voltage limiter circuit cooperatively produces a switch control voltage $V_{SWC}$ of substantially constant non-zero voltage, and is hence active, while the AC control voltage $V_{ACC}$ is active. Oppositely, when the AC control voltage $V_{ACC}$ is not active, the switch control voltage $V_{SWC}$ is essentially zero volts. The switch control voltage $V_{SWC}$ is applied within the electrical switching circuit 120 to an electronic switching unit, such as a field-effect transistor (FET). In the specific embodiment of FIG. 2, the electronic switching circuit is a p-channel enhancement-mode metal-oxide-semiconductor FET (MOSFET) $Q_1$ (part number BSS84P by Infineon Technologies AG) configured to conduct current in saturated mode through its drain-source junction when its gate-to-source voltage is negative beyond a nominal level as determined by the structure of the MOSFET $Q_1$. This situation occurs when the AC control voltage $V_{ACC}$ is active at the electrical switching circuit 120. In other words, the MOSFET $Q_1$ conducts when the AC control voltage $V_{ACC}$ is active (i.e., oscillating, typically in a substantially sinusoidal manner), and shuts off otherwise. Other types of electronic switching units, such as n-channel MOSFETS, junction FETs (JFETs), bipolar junction transistors (BJTs), solid state relays, or mechanical relays, may also be employed to similar end.

In the embodiment of FIG. 2, the FET $Q_1$, when conducting, operates to electrically couple the DC voltage $V_{DC}$ generated by the AC-to-DC converter circuit 110 with the load 130, shown in FIG. 1. In this particular case, a negatively-oriented switch control voltage $V_{SWC}$ of −15 V is applied to a p-channel FET $Q_1$ to apply a negative DC voltage $V_{DC}$ of −24 $V_{DC}$ onto the load 130. Alternatively, a positive switch control voltage $V_{SWC}$ may be used to switch a positive DC voltage $V_{DC}$ onto the load 130 via an n-channel FET $Q_1$. The load 130 is represented in FIG. 2 by the resistor $R_3$. In one embodiment, the resistor $R_3$ represents the input impedance of a solenoid, as discussed above. In one particular implementation, the value of the resistor $R_3$ represents a solenoid input impedance of 480Ω.

Figure 3:
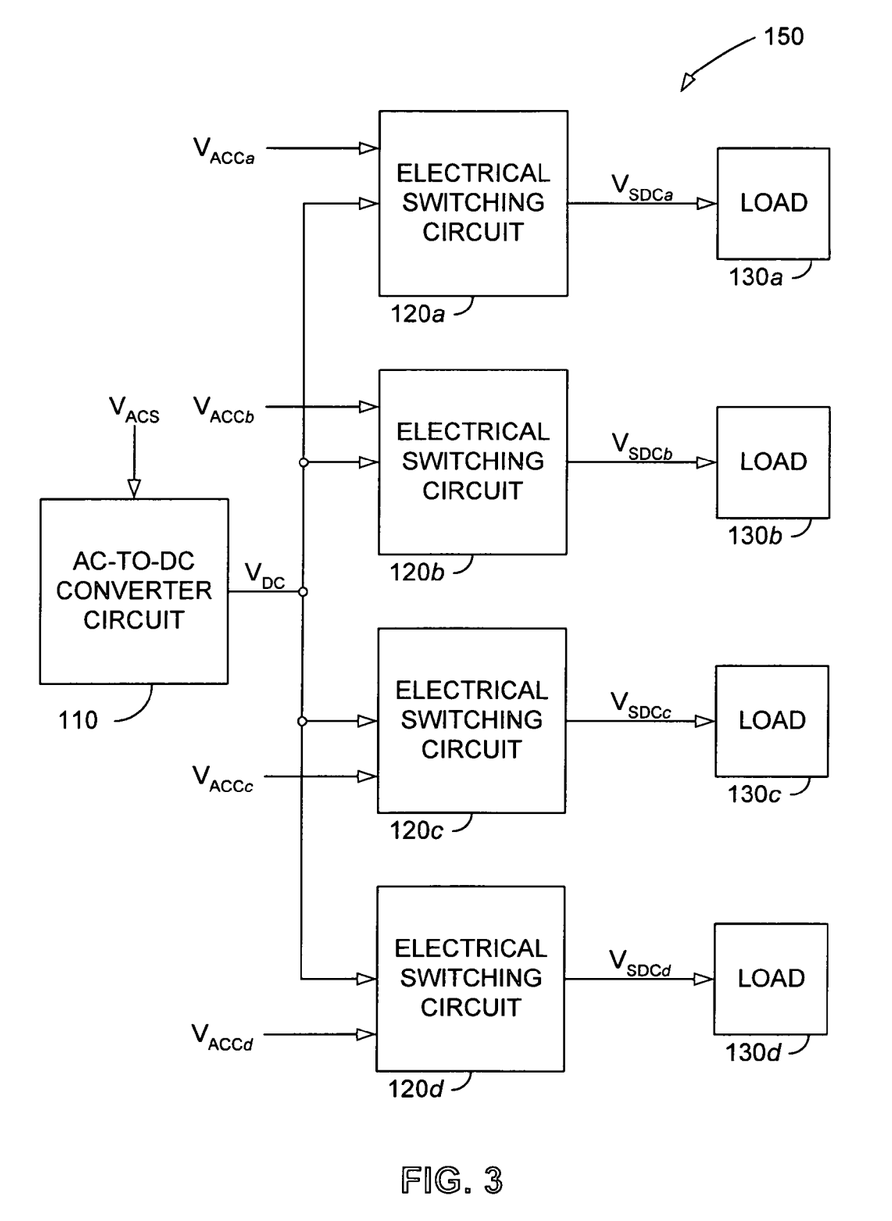
FIG. 3 is a schematic diagram of an electrical circuit according to an embodiment of the invention employing a single AC-to-DC converter circuit and multiple electrical switching circuits.

While the use of a single solenoid or similar load 130 benefits greatly from application of the various embodiments of the present invention as described above, multiple electrical switching circuits 120 may be employed in conjunction with a single AC-to-DC converter circuit 110 driven by a constant AC supply voltage $V_{ACS}$ to generate a DC voltage $V_{DC}$. A number of separate solenoids, such as that which may be found in a multiple valve system, may then be energized independently by such a circuit. For example, FIG. 3 depicts an electrical circuit 150 which employs a single AC-to-DC converter circuit 110 driven by an AC supply voltage $V_{ACS}$. The AC-to-DC converter circuit 110 drives four separate switching circuits 120a-120d, each of which is also driven by a separate AC control voltage $V_{ACCa}$-$V_{ACCd}$ intended to control each solenoid, represented by loads 130a-130d. Thus, each of the switching circuits 120a-120d switches the DC voltage $V_{DC}$ onto a load when the associated AC control voltage $V_{ACCa}$-$V_{ACCd}$ is active, and removes the DC voltage $V_{DC}$ from the associate load 130a-130d when the corresponding AC control voltage $V_{ACCa}$-$V_{ACCd}$ is not active. The resulting voltage at each load 130a-130d is a switched DC voltage $V_{SDCa}$-$V_{SDCd}$. While four loads 130a-130d are shown in the particular example of FIG. 3, applications requiring greater or fewer electrical switching circuits 120 are also possible.

Figure 4:
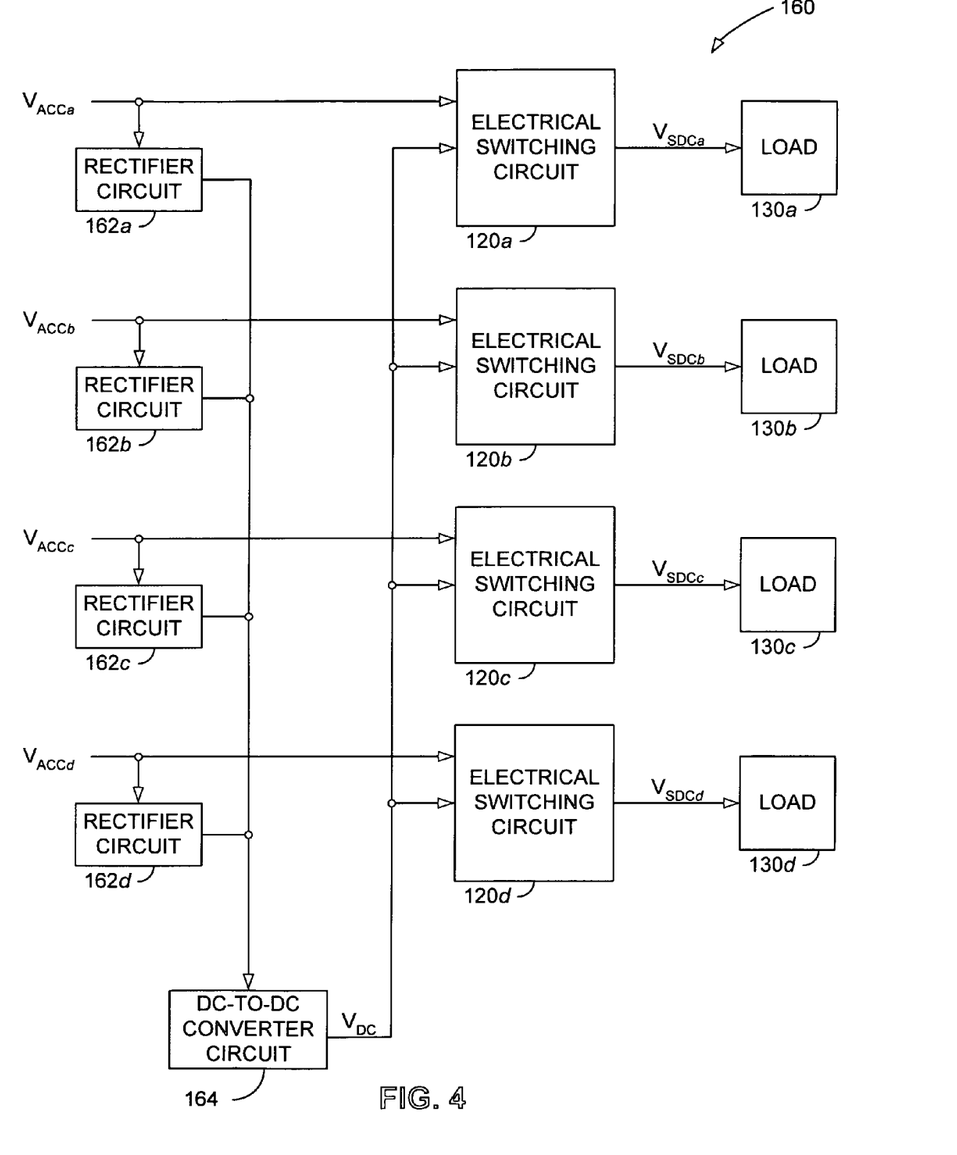
FIG. 4 is a schematic diagram of an electrical circuit according to an embodiment of the invention employing a multiple rectifier circuits, a single DC-to-DC converter circuit, and multiple electrical switching circuits.

In an alternative embodiment related to the electrical circuit 150 of FIG. 3, the DC voltage $V_{DC}$ may be generated by first rectifying each of the AC control voltages $V_{ACCa}$-$V_{ACCd}$ by way of rectifiers 162a-162d as shown in the electrical circuit 160 of FIG. 4. The rectification may be half-wave rectification, possibly by way of diodes and capacitors, as shown in FIG. 2. The resulting rectified signals may then be coupled together to drive a DC-to-DC converter circuit 164 to produce the DC voltage $V_{DC}$. One advantage of this embodiment is that a separate AC supply voltage $V_{ACS}$ would not be required. Instead, the AC control voltages $V_{ACCa}$-$V_{ACCd}$ act collectively in the electrical circuit 160 to provide the functionality of the AC supply voltage $V_{ACS}$. Further, a single DC-to-DC converter 164 provides the voltage conversion required, even though several AC control voltages $V_{ACCa}$-$V_{ACCd}$ are employed to ultimately produce the DC voltage $V_{DC}$. Also, the DC voltage $V_{DC}$ would be available any time one or more of the AC control voltages $V_{ACCa}$-$V_{ACCd}$ were active, thus reducing the time required to energize any of the solenoids represented by the loads 130a-130d.

Figure 5:
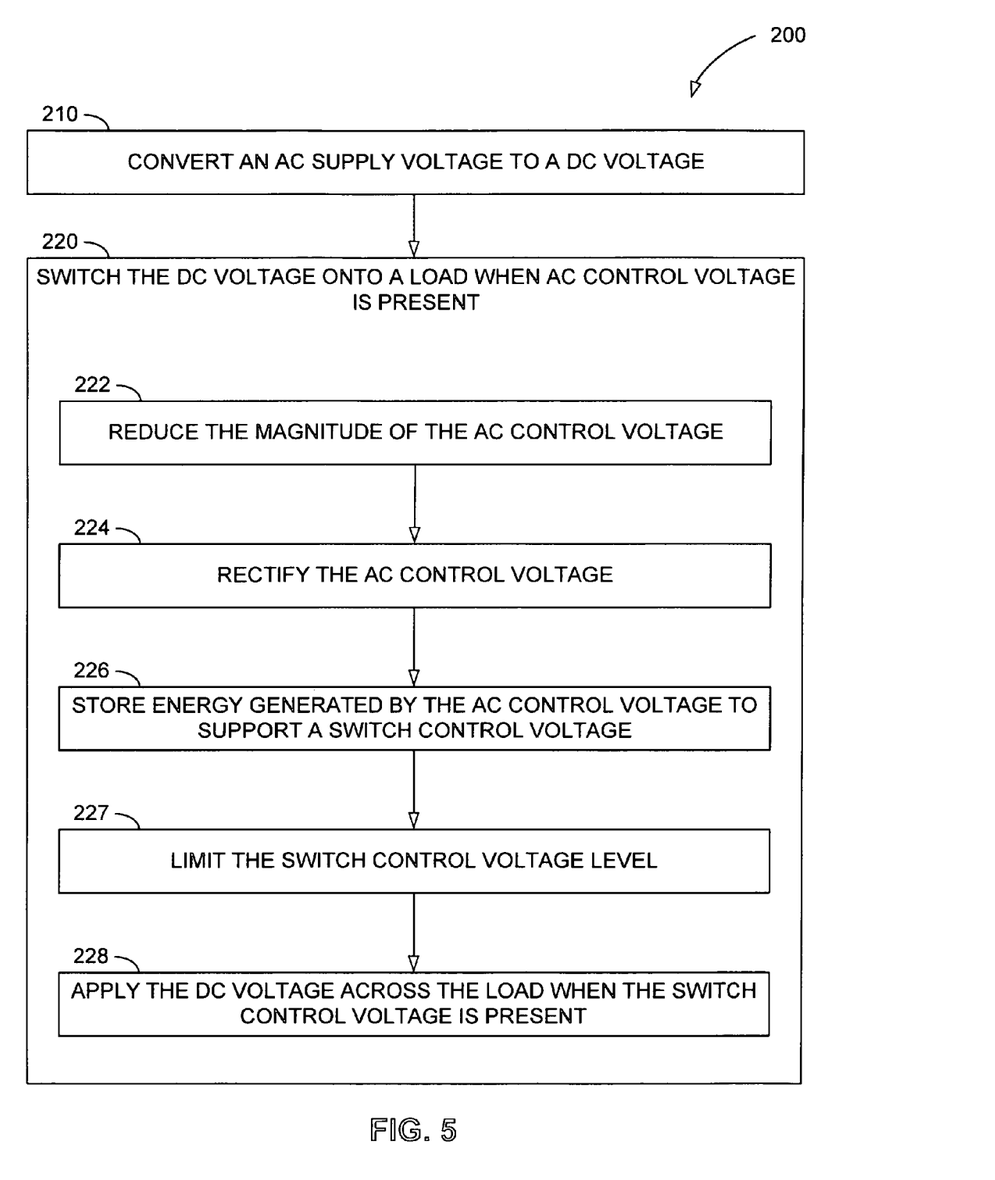
FIG. 5 is a flow chart of a method according to an embodiment of the invention of converting an AC supply voltage to a DC voltage, and switching the DC voltage onto a load by way of an AC control voltage.

In other embodiments of the invention, a method 200 for employing an AC supply voltage to produce a DC voltage which is switched onto a load by way of an AC control voltage is shown in FIG. 5. Generally, the AC supply voltage is converted to the DC voltage (operation 210), such as by way of an AC-to-DC converter. The DC voltage is switched onto a load when the AC control voltage is present (operation 220). To perform the switching operation, the AC control voltage may be reduced in magnitude (operation 222), possibly by way of a voltage divider circuit, and rectified (operation 224), such as by way of a half-wave rectifier, to help generate a separate switch control voltage. Electrical energy, such as in the form of electrical charge, generated by the AC control voltage may also be stored to support the resulting switch control voltage level (operation 226), such as during short time periods when the reduced and rectified AC control voltage is low. In addition, the switch control voltage level may be limited (operation 227), such as by way of a zener diode, to provide a stable, predetermined maximum limit for the switch control voltage. The switch control voltage is then employed to apply the DC voltage across a load (operation 228).

Employing the electrical circuits 100, 150, 160 or the method 200 according to various embodiments of the invention in the environment of a solenoid-actuated valve produces several potential advantages. For example, by converting an AC voltage to a DC voltage, either voltage can be used to energize a solenoid design accepting the DC voltage, so that a single solenoid design can be employed in either environment. This single design capability thus reduces the number of varying designs for solenoids, valves and related components that must be stocked to satisfy both environments. Solenoids energizable at a DC voltage also tend to be less expensive than those energizable at a higher AC voltage. In addition, since smaller, more closely spaced traces or wires may generally be utilized in conjunction with lower DC voltages when compared to higher AC voltages in order to satisfy various safety requirements, smaller PCBs and related connectors may be employed when either the higher AC voltage or the lower DC voltage is utilized as an energizing source. Also from a safety standpoint, the use of embodiments of the invention likely reduces the number of customer-accessible points at which a high AC voltage is present, due to the voltage reduction to a lower DC voltage to energize the associated solenoid. One or more of these advantages, or others, may also be realized in other applications employing one or more embodiments of the present invention.

While several embodiments of the invention have been discussed herein, other embodiments encompassed within the scope of the invention are possible. For example, different AC and DC voltage levels may be involved in alternative embodiments, thus possibly indicating the use of varying component values than those disclosed herein. Further, while the disclosed embodiments are discussed in relation to the energizing of a solenoid-actuated valve, numerous other applications requiring an input AC or DC voltage may also benefit from various aspects of the invention. Also, aspects of one embodiment may be combined with those of alternative embodiments to create further implementations of the present invention. Thus, while the present invention has been described in the context of specific embodiments, such descriptions are provided for illustration and not limitation. Accordingly, the proper scope of the present invention is delimited only by the following claims.

What is claimed is:

1. An electrical circuit (100) for switching a DC voltage onto a first and at least a second load (130) by way of a first and at least a second AC control voltage, the second AC control vohage comprising a signal separate from the first AC control voltage, the electrical circuit (100) comprising:
    a first rectifier circuit configured to rectify the first AC control voltage;
    a second rectifier circuit configured to rectify the second AC control voltage;
    a DC-to-DC converter circuit driven by the first rectifier circuit and the second rectifier circuit, and configured to generate the DC voltage when the first or second AC control voltage is active;
    a first electrical switching circuit (120) coupled to the first AC control voltage and configured to couple the DC voltage onto the first load (130) when the first AC control voltage is active and to decouple the DC voltage from the load (130) when the AC control voltage is inactive; and
    at least a second electrical switching circuit (120) coupled to the second AC control voltage and configured to switch the DC voltage onto the at least second load (130) when the at least second AC control voltage is active.

2. The electrical circuit (100) of claim 1, wherein at least one of the first or the at least second electrical switching circuits (120) comprises:
    a voltage magnitude reduction circuit configured to be driven by the corresponding AC control voltage;
    a rectifier circuit operably coupled with the voltage magnitude reduction circuit;
    a voltage limiter circuit operably coupled with the rectifier circuit;
    an energy storage circuit operably coupled with the voltage limiter circuit;
    wherein the voltage magnitude reduction circuit, the rectifier circuit, the voltage limiter circuit and the energy storage circuit are configured to cooperatively generate a switch control voltage, the switch control voltage being active and substantially constant when the corresponding AC control voltage is active; and
    an electronic switching unit configured to switch the DC voltage onto the load (130) when the switch control voltage is active.

3. The electrical circuit (100) of claim 2, the voltage magnitude reduction circuit comprising a voltage divider circuit the voltage divider circuit comprising:
    a first resistor and a second resistor coupled in series and configured to be placed across the corresponding AC control voltage.

4. The electrical circuit (100) of claim 2, the rectifier circuit comprising a diode.

5. The electrical circuit (100) of claim 2, the voltage limiter circuit comprising a zener diode configured to limit the switch control voltage by way of a reverse breakdown voltage of the zener diode.

6. The electrical circuit (100) of claim 2, the energy storage circuit comprising a capacitor.

7. The electrical circuit (100) of claim 2, the electronic switching unit comprising a field-effect transistor.

8. A solenoid-actuated valve system comprising the electrical circuit (100) of claim 1.

9. A method of switching a DC voltage onto a first and at least a second load by way of a first and at least a second AC control voltage, the second AC control voltage comprising a signal separate from the first AC control voltage, the method comprising:
    rectifying the first AC control voltage with a first rectifier circuit;
    rectifying the at least second AC control voltage with a second rectifier circuit;
    converting the rectified first AC control voltage and the rectified at least second AC control voltage to the DC voltage using a DC-to-DC converter circuit driven by the first rectifier circuit and the second rectifier circuit when the first or the at least second AC control voltage is active;
    switching the DC voltage onto the first load when the first AC control voltage is active;
    removing the DC voltage from the first load when the first AC control voltage is inactive; and
    switching the DC voltage onto the at least second load when the at least second AC control voltage is active.

10. The method of claim 9, wherein switching the DC voltage onto the first load when the first AC control voltage is active further comprises:
    reducing the magnitude of the first AC control voltage;
    rectifying the first AC control voltage;
    storing energy generated by the first AC control voltage to support a switch control voltage;
    limiting the voltage level of the switch control voltage; and
    applying the DC voltage across the load when the switch control voltage is active.

11. The method of claim 10, wherein rectifying the first AC control voltage comprises half-wave-rectifying the first AC control voltage.

* * * * *